United States Patent
Zhang et al.

(10) Patent No.: US 9,159,667 B2
(45) Date of Patent: Oct. 13, 2015

(54) METHODS OF FORMING AN E-FUSE FOR AN INTEGRATED CIRCUIT PRODUCT AND THE RESULTING E-FUSE STRUCTURE

(71) Applicant: GLOBALFOUNDRIES Inc., Grand Cayman (KY)

(72) Inventors: Xiaoqiang Zhang, Rexford, NY (US); O Sung Kwon, Wappingers Falls, NY (US); Jianghu Yan, Ballston Lake, NY (US); Wen-Hu Hung, Mechanicville, NY (US); Roderick Miller, Mechanicville, NY (US); HongLiang Shen, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 17 days.

(21) Appl. No.: 13/951,654

(22) Filed: Jul. 26, 2013

(65) Prior Publication Data

US 2015/0028447 A1   Jan. 29, 2015

(51) Int. Cl.
*H01L 21/8238* (2006.01)
*H01L 23/525* (2006.01)
*H01L 21/768* (2006.01)
*H01L 27/06* (2006.01)

(52) U.S. Cl.
CPC ...... *H01L 23/5256* (2013.01); *H01L 21/76838* (2013.01); *H01L 27/0617* (2013.01)

(58) Field of Classification Search
CPC ............... H01L 23/5256; H01L 21/76838; H01L 27/0617
USPC ......................................................... 438/200
See application file for complete search history.

(56) References Cited

U.S. PATENT DOCUMENTS

| | | |
|---|---|---|
| 6,720,820 B1 | 4/2004 | Chuang et al. |
| 7,098,721 B2 | 8/2006 | Ouellette et al. |
| 7,129,769 B2 | 10/2006 | Dixon et al. |
| 7,381,594 B2 | 6/2008 | Hsu et al. |
| 7,382,036 B2 | 6/2008 | Nowak et al. |
| 7,394,089 B2 | 7/2008 | Doyle et al. |
| 7,434,127 B2 | 10/2008 | Riley |
| 7,477,555 B2 | 1/2009 | Anand et al. |
| 7,489,180 B2 | 2/2009 | Marshall |
| 7,489,572 B2 | 2/2009 | Aipperspach et al. |
| 7,491,965 B2 | 2/2009 | Doyle et al. |
| 7,501,879 B1 | 3/2009 | Oh et al. |
| 7,572,724 B2 | 8/2009 | Nowak et al. |
| 7,659,168 B2 | 2/2010 | Hsu et al. |
| 7,902,903 B2 | 3/2011 | Rosik et al. |
| 7,960,809 B2 | 6/2011 | Kothandaraman et al. |
| 7,977,754 B2 | 7/2011 | Chuang et al. |

(Continued)

*Primary Examiner* — Ajay K Arora
(74) *Attorney, Agent, or Firm* — Amerson Law Firm, PLLC

(57) ABSTRACT

An e-fuse device disclosed herein includes an anode and a cathode that are conductively coupled to the doped region formed in a substrate, wherein the anode includes a first metal silicide region positioned on the doped region and a first conductive metal-containing contact that is positioned above and coupled to the first metal silicide region, and the cathode includes a second metal silicide region positioned on the doped region and a second conductive metal-containing contact that is positioned above and conductively coupled to the second metal silicide region. A method disclosed herein includes forming a doped region in a substrate for an e-fuse device and performing at least one common process operation to form a first conductive structure on the doped region of the e-fuse device and a second conductive structure on a source/drain region of a transistor.

12 Claims, 6 Drawing Sheets

(56) References Cited

U.S. PATENT DOCUMENTS

| | | | |
|---|---|---|---|
| 8,003,461 B1 | 8/2011 | Hsu et al. | |
| 8,004,059 B2 | 8/2011 | Kim et al. | |
| 8,035,191 B2 | 10/2011 | Lin et al. | |
| 8,071,437 B2 | 12/2011 | Lin et al. | |
| 8,134,854 B2 | 3/2012 | Huang | |
| 8,279,700 B2 | 10/2012 | Wada et al. | |
| 8,294,239 B2 | 10/2012 | Min | |
| 8,299,570 B2 | 10/2012 | Kim et al. | |
| 8,304,839 B2 | 11/2012 | Thei et al. | |
| 8,324,046 B2 | 12/2012 | Thei et al. | |
| 8,329,515 B2 | 12/2012 | Yang et al. | |
| 2001/0053601 A1* | 12/2001 | Mogami | 438/658 |
| 2002/0005553 A1* | 1/2002 | Ootsuka et al. | 257/369 |
| 2004/0080357 A1 | 4/2004 | Chuang et al. | |
| 2005/0286332 A1 | 12/2005 | Uvieghara | |
| 2006/0157819 A1 | 7/2006 | Wu | |
| 2006/0203592 A1 | 9/2006 | Uvieghara | |
| 2006/0203593 A1 | 9/2006 | Uvieghara | |
| 2007/0081396 A1 | 4/2007 | Gordon et al. | |
| 2007/0222028 A1 | 9/2007 | Matsuoka et al. | |
| 2009/0001506 A1 | 1/2009 | Kim et al. | |
| 2009/0039462 A1 | 2/2009 | Huang | |
| 2009/0079439 A1 | 3/2009 | Kuo | |
| 2009/0175106 A1 | 7/2009 | Aipperspach et al. | |
| 2009/0310266 A1 | 12/2009 | Etherton et al. | |
| 2010/0067319 A1 | 3/2010 | Aipperspach et al. | |
| 2010/0078727 A1 | 4/2010 | Min et al. | |
| 2010/0232248 A1 | 9/2010 | Erickson et al. | |
| 2011/0083057 A1 | 4/2011 | Huang | |
| 2011/0189827 A1 | 8/2011 | Hsu et al. | |
| 2012/0043614 A1* | 2/2012 | Choi et al. | 257/369 |
| 2012/0187529 A1 | 7/2012 | Maciejewski et al. | |
| 2012/0196423 A1 | 8/2012 | Kanike et al. | |

* cited by examiner

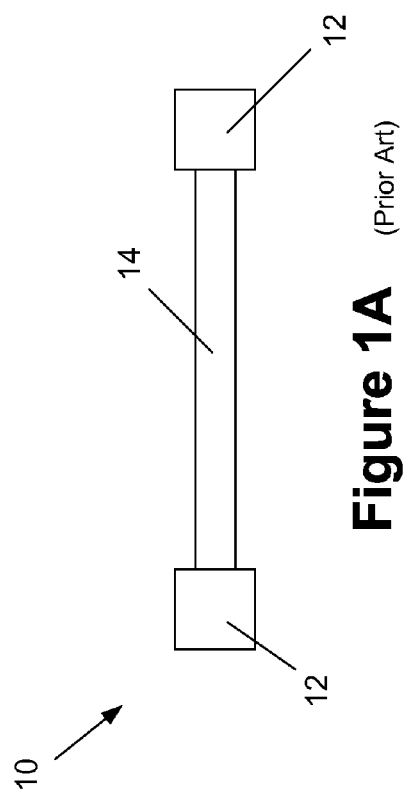
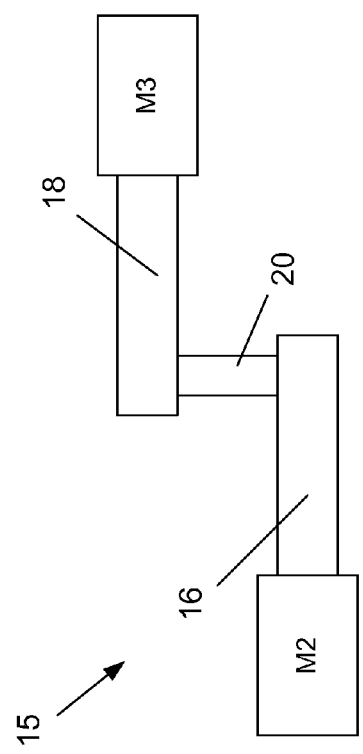

METHODS OF FORMING AN E-FUSE FOR AN INTEGRATED CIRCUIT PRODUCT AND THE RESULTING E-FUSE STRUCTURE

BACKGROUND OF THE INVENTION

1. Field of the Invention

Generally, the present disclosure relates to the manufacture of semiconductor devices, and, more specifically, to various methods of making an e-fuse for use on integrated circuit products and the resulting e-fuse device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NMOS transistors and/or PMOS transistors, are formed on a substrate including a crystalline semiconductor layer. A field effect transistor, whether an NMOS or a PMOS device, is a planar device that typically includes a source region, a drain region, a channel region that is positioned between the source region and the drain region, and a gate structure positioned above the channel region. The gate structure is typically comprised of a very thin gate insulation layer and one or more conductive layers that act as a conductive gate electrode. In a field effect transistor, the conductivity of the channel region, i.e., the drive current capability of the conductive channel, is controlled by applying an appropriate voltage to the gate electrode.

For many early device technology generations, the gate structures of most transistor devices were made using silicon-based materials, such as a silicon dioxide and/or silicon oxynitride gate insulation layer, in combination with a polysilicon gate electrode. However, as the channel length of aggressively scaled transistor devices has become increasingly smaller, many newer generation transistor devices employ gate electrode structures comprised of a so-called high-k gate insulation layer (k value of 10 or greater) and a gate electrode structure comprised of one or more metal layers, i.e., high-k/metal gate structures (HK/MG). Transistor devices with such an HK/MG structure exhibit significantly enhanced operational characteristics as compared to the heretofore more commonly used silicon dioxide/polysilicon ($SiO_2$/poly) configurations.

One well-known processing method that has been used in recent years for forming a transistor with a high-k/metal gate structure is the so-called "gate last" or "replacement gate" technique. In general, the replacement gate process involves forming a basic transistor structure that includes a sacrificial or "dummy" gate insulation layer, a sacrificial or "dummy" gate electrode, sidewall spacers and source/drain regions in the substrate. The sacrificial gate insulation layer is typically made of silicon dioxide and the sacrificial gate electrode is typically made of polysilicon. After certain high-temperature process operations are performed, e.g., after the source/drain anneal process is performed to activate the implanted dopant materials and to repair any damage to the lattice structure of the substrate, the sacrificial gate electrode and the sacrificial gate insulation layer are removed to thereby define a gate cavity between the spacers where the "replacement gate", i.e., the high-k dielectric/metal gate structure, will be formed.

In modern integrated circuits, a very high number of individual circuit elements, such as field effect transistors in the form of CMOS, NMOS, PMOS elements, resistors, capacitors and the like, are formed on a single chip area. In addition to the large number of transistor elements, a plurality of passive circuit elements, such as capacitors, resistors and the like, are typically formed in integrated circuits that are used for a plurality of purposes, such as for decoupling.

Due to the reduced size of circuit elements, not only the performance of the individual transistor elements may be increased, but also their packing density may be improved, thereby providing the potential for incorporating increased functionality into a given chip area. For this reason, highly complex circuits have been developed which may include different types of circuits, such as analog circuits, digital circuits and the like, thereby providing entire systems on a single chip (SoC). Furthermore, in sophisticated micro-controller devices, an increasing amount of storage capacity may be provided on a chip with the CPU core, thereby also significantly enhancing the overall performance of modern computer devices.

For a variety of reasons, the various circuit portions may have significantly different performance capabilities, for instance with respect to useful lifetime, reliability and the like. For example, the operating speed of a digital circuit portion, such as a CPU core and the like, may depend on the configuration of the individual transistor elements and also on the characteristics and performance of the metallization system coupled to the CPU core. Consequently, the combination of the various circuit portions in a single semiconductor device may result in a significantly different behavior with respect to performance and reliability. Variations in the overall manufacturing process flow may also contribute to further variations in the performance capabilities between various circuit portions. For these reasons, in complex integrated circuits, frequently, additional mechanisms are used so as to allow the circuit itself to adapt or change the performance of certain circuit portions to comply with the performance characteristics of other circuit portions. Such mechanisms are typically used after completing the manufacturing process and/or during use of the semiconductor device. For example, when certain critical circuit portions no longer comply with corresponding device performance criteria, adjustments may be made, such as re-adjusting an internal voltage supply, re-adjusting the overall circuit speed and the like, to correct such underperformance.

In computing, e-fuses are used as a means to allow for the dynamic, real-time reprogramming of computer chips. Speaking abstractly, computer logic is generally "etched" or "hard-coded" onto a silicon chip and cannot be changed after the chip has been manufactured. By utilizing an e-fuse, or a number of individual e-fuses, a chip manufacturer can change some aspects of the circuits on a chip. If a certain sub-system fails, or is taking too long to respond, or is consuming too much power, the chip can instantly change its behavior by blowing an e-fuse. Programming of an e-fuse is typically accomplished by forcing a large electrical current through the e-fuse. This high current is intended to break or rupture a portion of the e-fuse structure, which results in an "open" electrical path. In some applications, lasers are used to blow e-fuses. Fuses are frequently used in integrated circuits to program redundant elements or to replace identical defective elements. Further, e-fuses can be used to store die identification or other such information, or to adjust the speed of a circuit by adjusting the resistance of the current path. Device manufacturers are under constant pressure to produce integrated circuit products with increased performance and lower power consumption relative to previous device generations. This drive applies to the manufacture and use of e-fuses as well.

Prior art e-fuses come in various configurations. FIGS. 1A-1B depict illustrative examples of some forms of prior art e-fuses. FIG. 1A is a plan view of a very simple e-fuse 10 comprised of conductive lines or structures 12 having a reduced-size metal line 14 coupled to the conductive structures 12. The e-fuse 10 may sometime be referred to as a "BEOL" type e-fuse as it is typically made using the materials used in forming various metallization layers in so-called Back-End-Of-Line activities.

FIG. 1B is a cross-sectional view of another type of e-fuse 15 that extends between two illustrative metal layers, M2 and M3, formed on an integrated circuit product. In general, the e-fuse 15 is comprised of schematically depicted conductive lines 16, 18 that are formed in the metallization layers M2, M3, respectively. A reduced-size metal structure or via 20 is conductively coupled to the conductive lines 16, 18. The e-fuse 15 may sometimes be referred to as an "I" type e-fuse due to its cross-sectional configuration. In some very early device generations, e-fuses were comprised of structures that included polysilicon line-type features as part of the e-fuse. The polysilicon line-type features for the e-fuses (i.e., a "poly fuse" or an "RX fuse") were typically patterned at the same time as was the polysilicon gate electrodes for the various transistor devices. A metal silicide material was typically formed on such poly fuses All of the above-described e-fuses typically worked by passing a sufficient current though the e-fuse such that, due to resistance heating, some portion or component of the e-fuse ruptured, thereby creating an open electrical circuit. Some types of e-fuses, such as BEOL e-fuses, require a relatively high programming current, e.g., about 25 mA or higher. Such a high programming current is generally not desirable for e-fuses, as such a high programming current will require a relatively larger programming transistor, which means increased consumption of valuable space on the chip. Moreover, a higher programming current degrades the sensing margin for sensing circuits that are used to determine whether or not the e-fuse is programmed, i.e., blown.

The present disclosure is directed to various methods of making an e-fuse for use on integrated circuit products and the resulting e-fuse device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of making an e-fuse for use on integrated circuit products and the resulting e-fuse device. One illustrative e-fuse device disclosed herein includes a doped region formed in a semiconductor substrate, an anode that is conductively coupled to the doped region, wherein the anode is of a first metal silicide region positioned on the doped region and a first conductive metal-containing contact that is positioned above and conductively coupled to the first metal silicide region, a cathode that is conductively coupled to the doped region and spaced apart from the anode, wherein the cathode includes a second metal silicide region positioned on the doped region and a second conductive metal-containing contact that is positioned above and conductively coupled to the second metal silicide region.

Another illustrative e-fuse device disclosed herein includes an N-doped or P-doped region formed in a semiconductor substrate, an anode that is conductively coupled to the doped region, wherein the anode includes a first metal silicide region positioned on the doped region and a first conductive metal-containing contact that is positioned above and conductively coupled to the first metal silicide region, and a cathode that is conductively coupled to the doped region and spaced apart from the anode, wherein the cathode includes a second metal silicide region positioned on the doped region and a second conductive metal-containing contact that is positioned above and conductively coupled to the second metal silicide region. In this embodiment, the first and second metal silicide regions are made of the same metal silicide and the first and second conductive structures are made of the same metal-containing material. In more detailed embodiments disclosed herein, a transistor is also formed in and above the substrate, wherein the transistor includes a doped source/drain region formed in the substrate, a third metal silicide region positioned on the doped source/drain region and a third conductive metal-containing contact that is positioned above and conductively coupled to the third metal silicide region. In this more detailed embodiment, the third metal silicide region is made of the same metal silicide as the first and second metal silicide regions and the third conductive structure is made of the same metal-containing material as the first and second conductive structures.

One illustrative method disclosed herein includes forming a doped region in a semiconductor substrate for an e-fuse device, forming a transistor structure in and above the substrate, wherein the transistor includes a doped source/drain region, and performing at least one first common process operation to form a first conductive structure that is positioned on the doped region of the e-fuse device and a second conductive structure that is positioned on the source/drain region of the transistor.

Yet another illustrative method disclosed herein includes forming a doped region in a semiconductor substrate for an e-fuse device, forming a transistor structure in and above the substrate, wherein the transistor includes a doped source/drain region, performing at least one first common process operation to form a first metal silicide region that is positioned on the doped region of the e-fuse device and a second metal silicide region that is positioned on the source/drain region of the transistor, wherein the first and second metal silicide regions are comprised of the same metal silicide, and performing at least one second common process operation to form a first conductive contact that is positioned above and conductively coupled to the first metal silicide region and a second conductive contact that is positioned above and conductively coupled to the second metal silicide region, wherein the first and second conductive contacts are comprised of the same metal-containing material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1B depict various illustrative examples of prior art e-fuse devices.

Figure 2A:
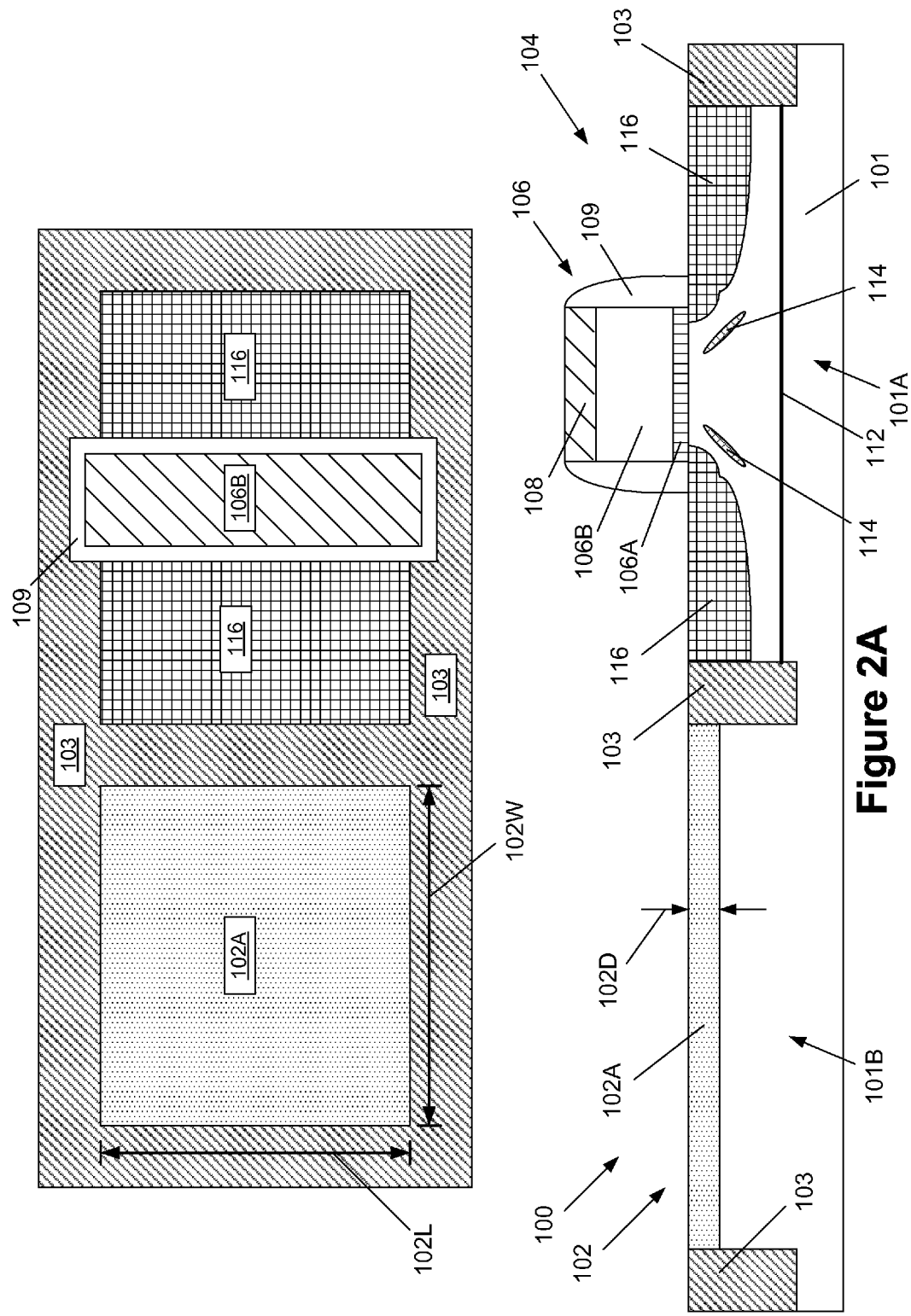
FIGS. 2A-2E depict various illustrative methods disclosed herein for making an e-fuse for use on integrated circuit products and illustrative examples of various novel e-fuse devices disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of making an e-fuse for use on integrated circuit products and the resulting e-fuse device. As will be readily apparent to those skilled in the art upon a complete reading of the present application, the various embodiments of the novel e-fuses disclosed herein may be employed on any type of integrated circuit product, including, but not limited to, logic devices, memory devices, ASICs, so-called system-on-chip products, etc. With reference to the attached figures, various illustrative embodiments of the novel e-fuse structures disclosed herein will now be described in more detail.

FIGS. 2A-2E depict one illustrative example wherein one illustrative embodiment of a novel e-fuse 102 disclosed herein is formed above a semiconductor substrate 101. Each of the drawings contains a cross-section view and a reduced-size plan view of the product 100. In one illustrative embodiment, all or parts of the e-fuse 102 may be formed by performing common process operations on another semiconductor device 104 that is formed above the substrate 101. In the illustrative example depicted herein, the semiconductor device 104 may be a field effect transistor. However, as will be appreciated by those skilled in the art after a complete reading of the present application, the semiconductor device 104 is intended to be representative of any type of semiconductor device or structure that may be formed on an integrated circuit product. The substrate 101 may have a variety of configurations, such as a bulk substrate configuration, or it may be the active layer of a silicon-on-insulator (SOI) substrate. The substrate 101 may be made of silicon or it may be made of materials other than silicon. Thus, the terms "substrate" or "semiconductor substrate" should be understood to cover all semiconducting materials and all forms of such materials.

The illustrative transistor shown in FIG. 2A is formed above an active region 101A defined in the substrate 101 while the illustrative e-fuse 102 is formed in and above an active region 101B. The active regions 101A, 101B are defined in the substrate 101 by illustrative isolation regions 103. The transistor may be either an NMOS or PMOS transistor. The transistor is generally comprised of a gate structure 106, sidewall spacers 109, a gate cap layer 108 and source/drain regions 116. The gate structure 106 is typically comprised of a gate insulation layer 106A and one or more conductive material layers that act as the gate electrode 106B for the transistor. In some embodiments, the gate structure 106 may be a high-k/metal gate structure that is comprised of a gate insulation layer 106A made of a high-k (k value greater than 10) material and one or more layers of metal that act as at least part of the gate electrode 106B. Also depicted in FIG. 2A is an illustrative well region 112 that may be doped with either N-type or P-type dopants, depending upon the type of transistor being manufactured. Also depicted are illustrative so-called halo implant regions 114 that have been formed in the substrate by performing one of more angled ion implantation processes.

At this point in fabrication, the e-fuse 102 is comprised of a doped region 102A formed in the active region 101B by performing at least one ion implantation process. The overall configuration of the e-fuse 102 may vary depending upon the particular application. In the depicted example, the e-fuse 102 has a generally square or rectangular configuration when viewed from above. In this example, the doped region 102A of the e-fuse 102 has a width 102W, a length 102L and a depth 102D, the dimensions of which may vary depending upon the particular application. The length 102L and the width 102W need not be the same, although they may be if desired. In one illustrative example, the ratio of the length 102L to the width 102W may fall within the range of about 0.02-20. In one illustrative example, the depth 102D of the doped region 102A may be about 5-5000 nm. The size of the doped region 102A may be independent relative to the size of any region or structure on the transistor device 104. Moreover, the doped region 102A may have a uniform depth across the active region 101B, but that is not required in all applications. For example, if desired, the doped region 102A may be formed by performing multiple implantation processes on a portion of the doped region 102A while other portions of the doped region 102A are exposed to only a single ion implantation process. This may be accomplished by forming the appropriate masking layers over parts of the doped region 102A and performing the desired ion implantation processes. The resulting doped region 102A may have a stepped profile when viewed in cross-section, e.g., a deeper implant region in the center of the doped region 102A than is present near the edges of the doped region 102A.

In one illustrative embodiment, the doped region 102A may be formed by performing a single ion implantation process so as to have the depicted uniform depth 102D shown in FIG. 2A. The doped region 102A may be formed with any N-type or P-type dopant material. The dopant dose and implant energy used in forming the doped region 102A may vary depending upon the particular application. The doped region 102A may be formed at any point in the process flow in manufacturing integrated circuit products in the substrate 101. In one illustrative embodiment, the doped region 102A may be formed at the same time as a doped region is formed for the transistor 104 depicted in FIG. 2A. For example, when the ion implantation process is performed on the transistor to form well-known extension implant regions for the source/drain region 116, the mask layer used in the extension implant process may also expose the active region 101B. In that case, the doped region 102A would have a depth and dopant concentration to that of the extension implant regions. Additionally, or alternatively, the active region 101B could be exposed to the deep source/drain implantation process that is performed on the transistor 104. Of course, if desired, the doped region 102A could be formed by performing a dedicated ion implantation process that is performed through a dedicated masking layer with the sole purpose being to form the doped region 102A. FIG. 2A depicts the product 100 at a point in fabrication where it is desired to form conductive contacts to the devices formed in and above the substrate 101.

Figure 2B:
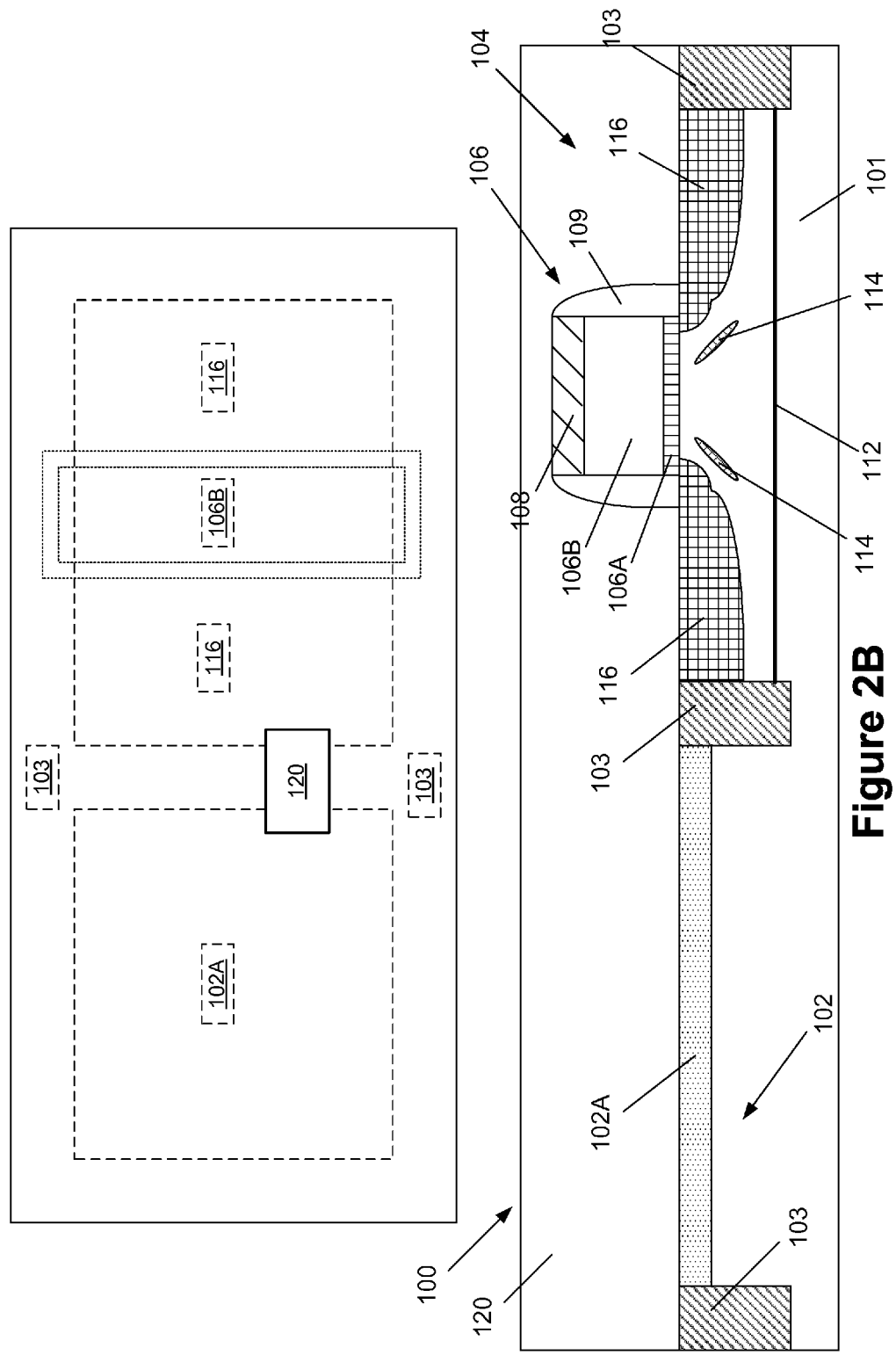

FIG. 2B depicts the product 100 after an illustrative layer of insulating material 120 has been formed above the substrate 101. The layer of insulating material 120 is intended to be representative in nature as more than one layer of insulating material may be formed above the product 100 prior to beginning the process of forming contact openings, etc. The layer of insulating material 120 may be comprised of a variety of different materials, such as silicon dioxide, a low-k (k value less than about 3.3) insulating material, and it may be formed by performing a variety of techniques, e.g., chemical vapor deposition (CVD), etc. The overall thickness of the representative layer of insulating material 120 may vary depending upon the particular application. The various regions and structures of the product 100 are depicted in dashed lines in the top view of the product 100 and in the drawings that follow.

Figure 2C:
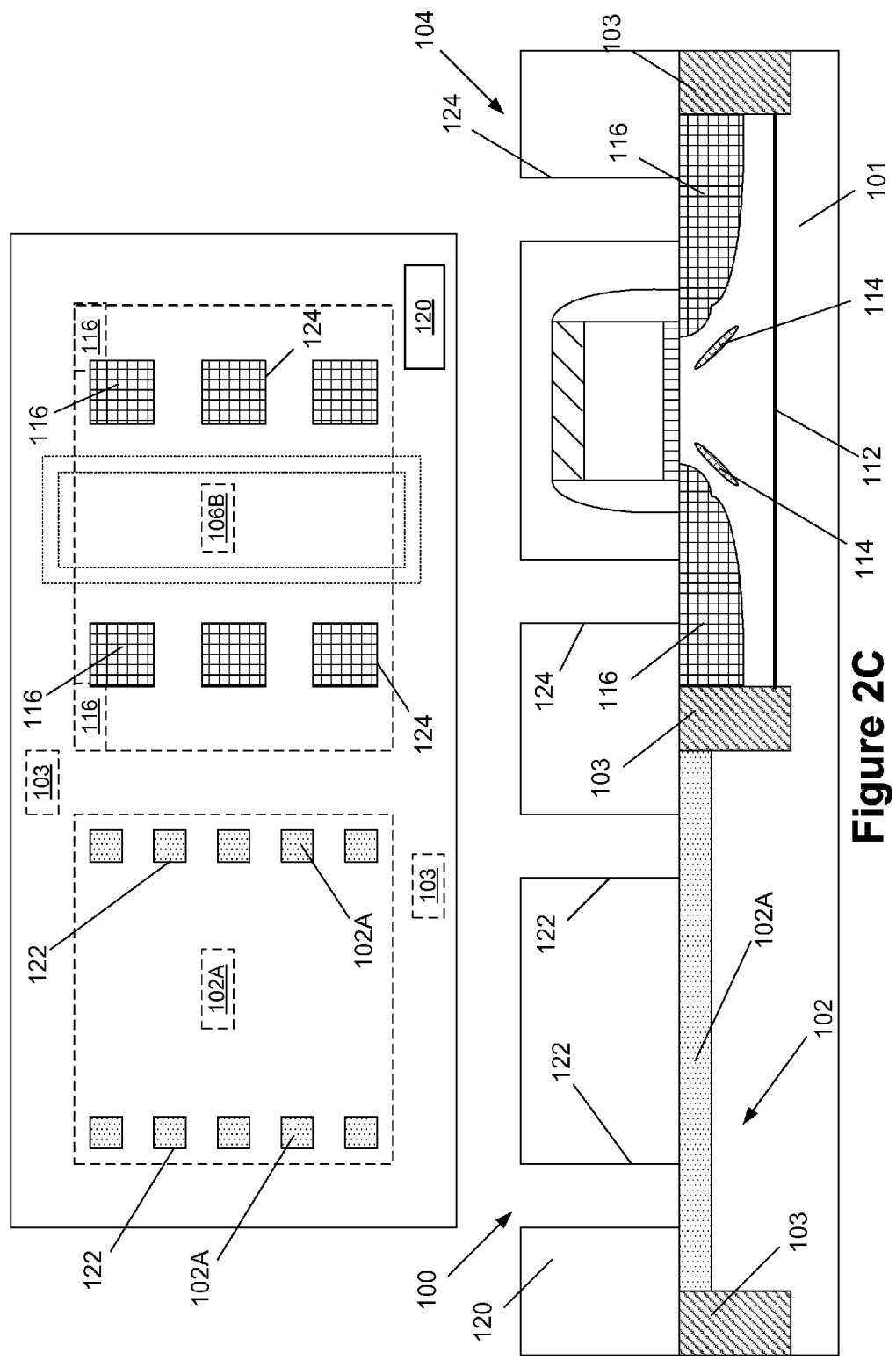

FIG. 2C depicts the product 100 after one or more common etching processes are performed on the layer of insulating material 120 through a patterned etch mask (not shown), such as a patterned layer of photoresist material, to thereby define a plurality of e-fuse contact openings 122 and a plurality of semiconductor device contact openings 124. The e-fuse contact openings 122 expose portions of the doped region 102A of the e-fuse 102, while the semiconductor device contact openings 124 expose portions of the source/drain regions 116 of the semiconductor device 104. The size, shape, number and location of the contact openings 122, 124 may vary depending upon the particular application, and the contact openings need not have the same size, shape or configuration, although that situation may occur in some applications. In the depicted example, the contact openings 122, 124 are depicted is substantially square-shaped, discrete, spaced-apart openings (in the plan view), with the contact openings 122 being smaller than the contact openings 124. Of course, if desired, the contact openings 122, 124 may have other configurations when viewed in plan view, e.g., circular, rectangular, etc. Additionally, instead of discrete, spaced-apart features, the contact openings 122 may be single linear trenches, while the contact openings 124 may remain as discrete spaced-apart openings, as depicted in FIG. 2C. Thus, the size, shape and configuration of the contact openings 122, 124 should not be considered to be a limitation of the presently disclosed inventions. After the contact openings 122, 124 are formed, the patterned etch mask is removed and the product is subjected to a cleaning process to remove any foreign elements from the portions of the doped region 102A and the source/drain regions 116 exposed by the contact openings 122, 124, respectively, in advance of forming metal silicide regions on such exposed portions of the substrate 101.

Figure 2D:
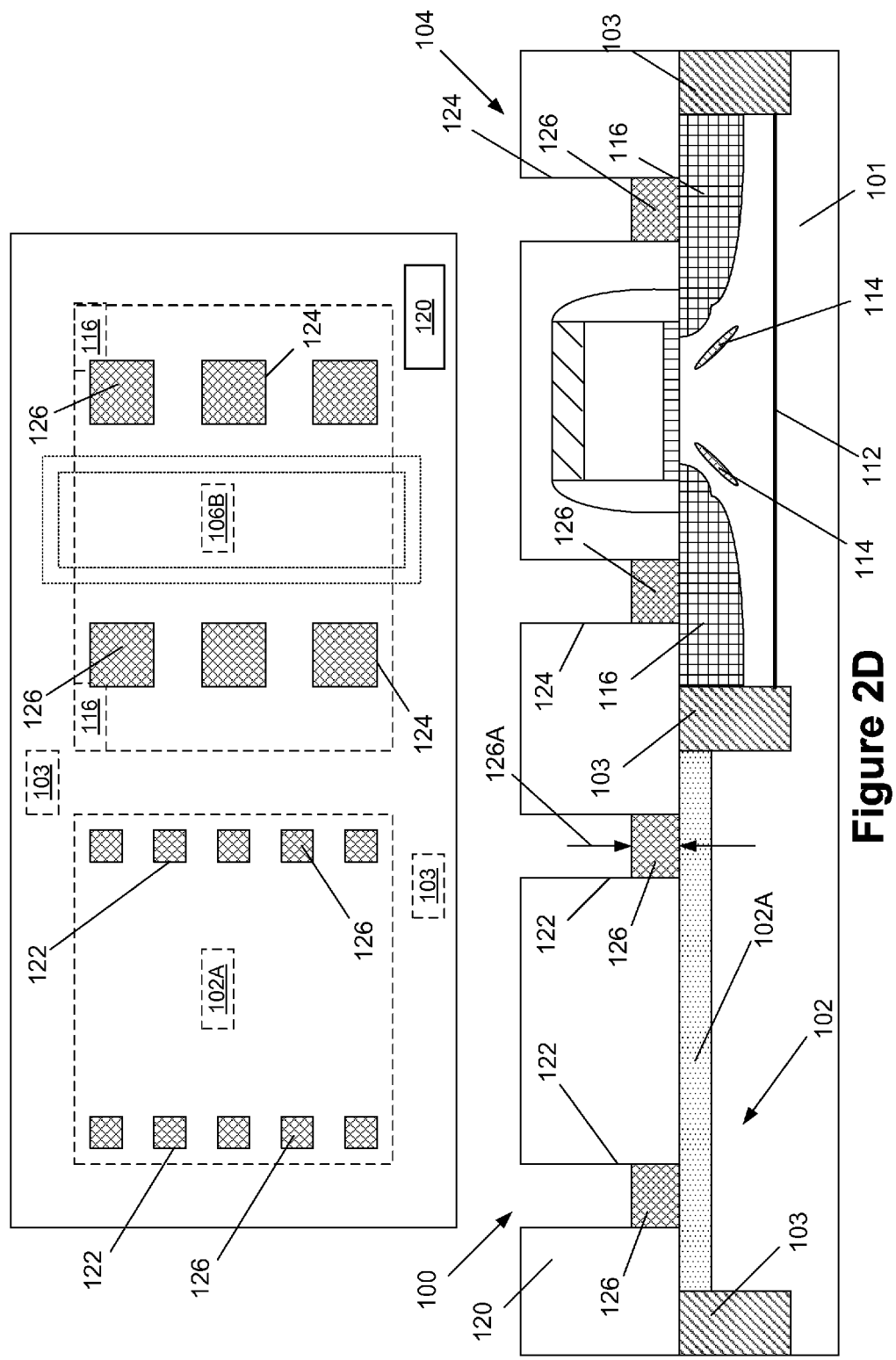

FIG. 2D depicts the product 100 after illustrative metal silicide regions 126 have been formed within the contact openings 122, 124 by performing a plurality of common process operations on both the e-fuse 102 and the semiconductor device 104. The formation of the metal silicide regions 126 may sometimes be referred to as a "trench-silicide" formation process. The metal silicide regions 126 may be comprised of any type of metal silicide material, e.g., nickel silicide, cobalt silicide, titanium silicide, platinum silicide, nickel-platinum silicide, etc., or a combination of such silicide materials. The overall thickness or height 126A of the metal silicide regions 126 may vary depending upon the particular application, e.g., 5-30 nm. In the depicted example, the metal silicide regions 126 are shown as having a uniform height 126A in all of the contact openings 122 and 124, although that may not be the case in all applications.

The metal silicide regions 126 may be formed using traditional techniques for forming such metal silicide materials. For example, a layer of a transitional and/or refractory metal, such as nickel, cobalt, titanium, platinum, etc., or a combination of such materials (e.g., NiPtSix), was deposited above the layer of insulating material 120 and in the contact openings 122, 124 in a common deposition process. In some cases, prior to the deposition of the layer of refractory metal, a pre-amorphization ion implant process may have been performed on the substrate 101 prior to the formation of the layer of insulating material 120 or such a pre-amorphization ion implant process may be performed on just the exposed portions of the substrate 101 exposed by the contact openings 122, 124. The pre-amorphization implant process is typically performed with relatively large inert ions, and the purpose of such an implant process is to make the amorphized region more receptive to the formation of a metal silicide region therein. The thickness of the layer of transitional refractory metal may vary depending on the particular application, e.g., 5-30 nm, and it may be formed by a variety of processes, e.g., physical vapor deposition (PVD). Thereafter, a first common anneal process, e.g., a first rapid thermal anneal (RTA) process, was performed on the entire product 100, i.e., on both the e-fuse 102 and the semiconductor device 104, at a temperature that falls within the range of about 300-750° C. for a duration of about 1.5 seconds or longer. During this first common RTA process, the metal in the layer of transitional/refractory metal reacts with the silicon in the substrate 101 to thereby form a relatively higher resistance form of metal silicide (not shown), e.g., a nickel disilicide ($NiSi_2$). Then, portions of the layer of transitional/refractory metal that did not react with the underlying substrate 101 during the first common RTA process are removed by performing a standard stripping process on both the e-fuse 102 and the semiconductor device 104. After the removal of the unreacted portions of the layer of refractory metal, a second common rapid thermal anneal (RTA) process was performed on both the e-fuse 102 and the semiconductor device 104 at a temperature that falls within the range of about 750-900° C. for a duration of about 1.5 seconds or longer. This second common RTA process converts the relatively higher resistance silicide region into the relatively lower resistance metal silicide regions 126 shown in FIG. 2D, e.g., nickel monosilicide (NiSi).

Figure 2E:
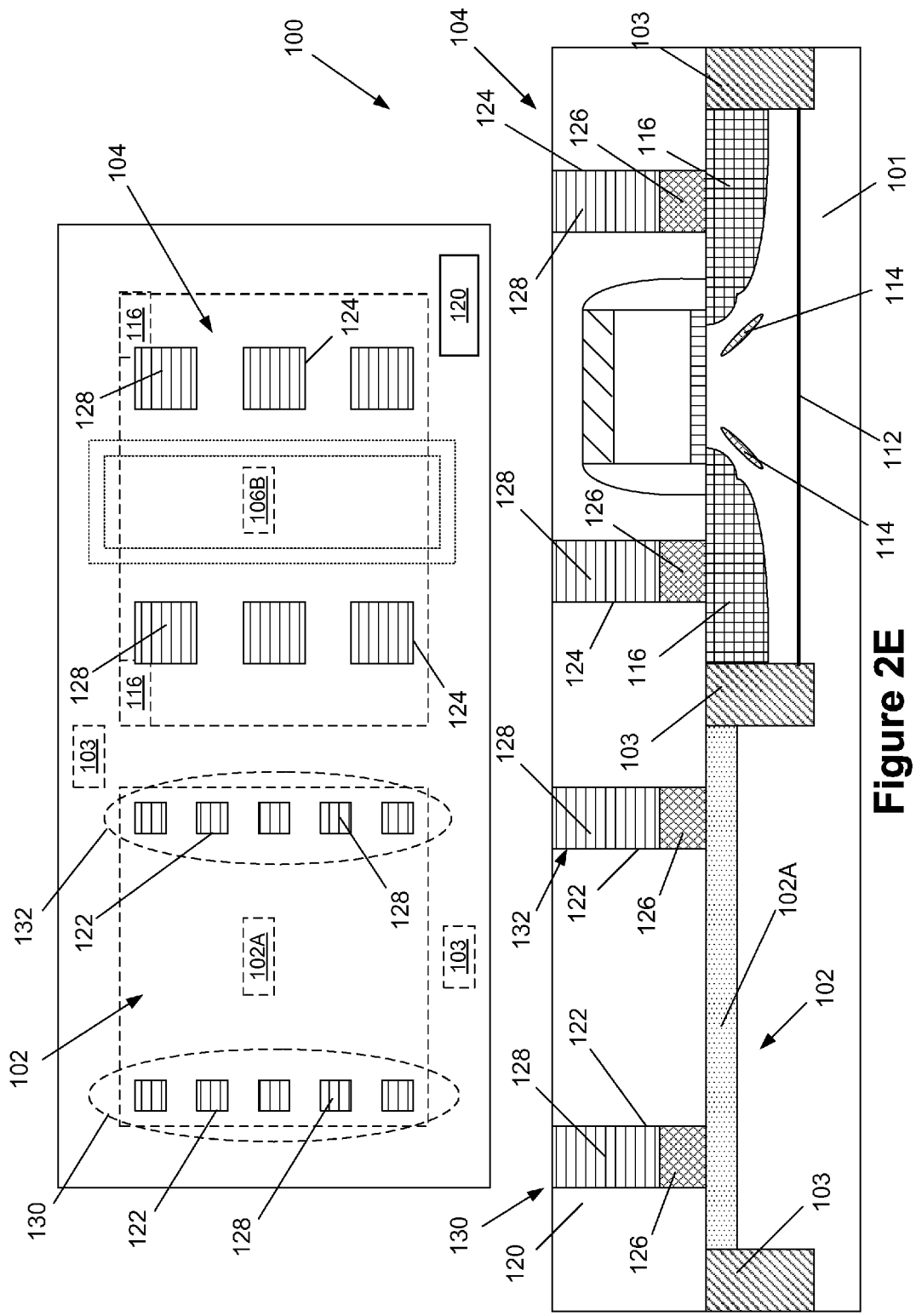

FIG. 2E depicts the product 100 after illustrative conductive contact structures 128 are formed in the contact openings 122, 124 by performing several common process operations on both the e-fuse 102 and the semiconductor device 104 at the same time. The conductive contact structures 128 may be formed using traditional materials and traditional manufacturing techniques. As depicted, the conductive contact structures 128 are conductively coupled to the metal silicide regions 126 which are, in turn, conductively coupled to the underlying doped regions 102A, 116 of the e-fuse 102 and the semiconductor device 104, respectively. The conductive contact structures 128 are intended to be representative in nature as they may be comprised of any of a variety of different conductive materials, such as tungsten or cobalt, and they may have any desired shape, size or configurations. The conductive structures 128 may also include one or more barrier/adhesion layers that are formed in the contact openings 122, 124, but such barrier/adhesion layers are not depicted in the attached drawings. In the depicted example, the metal silicide regions 126 are depicted as being shorter in vertical height than the conductive structures 128, although such a configuration may not be present in all applications, e.g., in some applications, the metal silicide regions 126 may be taller than the conductive structures 128.

With continuing reference to FIG. 2E, a first group of the contacts 128/metal silicide regions 126 may constitute an anode 130 of the e-fuse device 102, while a second group of the contacts 128/metal silicide regions 126 may constitute the cathode 132 of the e-fuse device 102, or vice-versa. In one embodiment, the contacts 128 and/or metal silicide regions 126 of either the anode 130 or the cathode 132, or both, of the e-fuse device 102 are sized such that when an appropriate programming current is directed to the anode/cathode, the anode/cathode will rupture, thereby creating the desired open circuit, or form an electrical/physical disconnection by means of controllable electromigration (EM). The magnitude of the programming current will vary depending upon the particular application, e.g., 5-15 mA. In another illustrative embodiment, the e-fuse 102 may be programmed by setting a current that causes electromigration of metal elements in the contacts 128 and/or metal silicide regions 126 of either the anode 130 or the cathode 132, or both. For example, a relatively low programming current, e.g., about 7 mA, may be passed through the anode 130, the cathode 132, or both, for a duration of about 2-10 microseconds to cause the desired electromigration until such time as a rupture occurs, thereby creating the desired open circuit.

As will be recognized by those skilled in the art after a complete reading of the present application, the e-fuse device 102 disclosed herein provides several advantages as compared to prior art e-fuse devices and methods of making such prior art devices. For example, the illustrative e-fuse device 102 disclosed herein may be programmed with a relatively smaller programming current as compared to, for example, some prior art BEOL e-fuses due to the fact that, in the e-fuse 102 disclosed herein, a vertical disconnection may be more readily formed because it is intrinsically easier to cause electromigration in the metal silicide material portion of the anode/cathode described herein, and because the locally confined heating brings the area to a higher temperature, e.g., 700-1500° C., in a relatively short period of time. Additionally, in the illustrative example where the metal silicide regions 126 and the conductive structures 128 are formed by performing common process operations on both the e-fuse 102 and the semiconductor device 104, manufacturing efficiencies may be increased, leading to an overall decrease in product costs. Other advantages will be recognized by those skilled in the art after a complete reading of the present application.

Note that the use of terms such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a doped region in a semiconductor substrate for an e-fuse device;
    forming a transistor structure in and above said substrate, said transistor comprising a doped source/drain region positioned in said substrate, wherein forming said doped region comprises performing a common implantation process to implant a dopant ion into said substrate to define said doped region and at least a portion of said source/drain region; and
    performing at least one first common process operation to form a first conductive structure that is positioned on said doped region of said e-fuse device and a second conductive structure that is positioned on said source/drain region of said transistor.

2. The method of claim 1, wherein performing said at least one first common process operation to form said first and second conductive structures comprises performing said at least one first common process operation to form said first and second conductive structures that are comprised a metal silicide.

3. The method of claim 1, further comprising performing at least one second common process operation to form a first conductive contact that is positioned above and conductively coupled to said first conductive structure and a second conductive contact that is positioned above and conductively coupled to said second conductive structure.

4. The method of claim 1, wherein performing said at least one second common process operation to form said first and second conductive contacts comprises performing said at least one second common process operation to form said first and second conductive contacts that are comprised of the same metal-containing material.

5. The method of claim 2, wherein performing said at least one first common process operation comprises:
- depositing a layer of transitional/refractory metal above at least a portion of said doped region of said e-fuse device and above said doped source/drain region of said transistor;
- performing at least one heat treatment process to cause portions of said layer of transitional/refractory metal to react with said substrate; and
- after performing said at least one heat treatment process, removing unreacted portions of said layer of transitional/refractory metal.

6. The method of claim 3, wherein performing said at least one second common process operation to form said first and second conductive contacts comprises depositing a layer of metal in a plurality of openings formed in a layer of insulating material and performing a chemical mechanical polishing process to remove excess portions of said deposited layer of metal.

7. A method, comprising:
- forming a doped region in a semiconductor substrate for an e-fuse device;
- forming a transistor structure in and above said substrate, said transistor comprising a doped source/drain region positioned in said substrate, wherein forming said doped region comprises performing a common implantation process to implant a dopant ion into said substrate to define said doped region and at least a portion of said source/drain region;
- performing at least one first common process operation to form a first metal silicide region that is positioned on said doped region of said e-fuse device and a second metal silicide region that is positioned on said source/drain region of said transistor, wherein said first and second metal silicide regions are comprised of the same metal silicide; and
- performing at least one second common process operation to form a first conductive contact that is positioned above and conductively coupled to said first metal silicide region and a second conductive contact that is positioned above and conductively coupled to said second metal silicide region, wherein said first and second conductive contacts are comprised of the same metal-containing material.

8. The method of claim 7, wherein performing said at least one first common process operation comprises:
- depositing a layer of transitional/refractory metal above at least a portion of said doped region of said e-fuse device and above said doped source/drain region of said transistor;
- performing at least one heat treatment process to cause portions of said layer of transitional/refractory metal to react with said substrate; and
- after performing said at least one heat treatment process, removing unreacted portions of said layer of transitional/refractory metal.

9. The method of claim 7, wherein performing said at least one second common process operation to form said first and second conductive contacts comprises depositing a layer of metal in a plurality of openings formed in a layer of insulating material and performing a chemical mechanical polishing process to remove excess portions of said deposited layer of metal.

10. The method of claim 1, wherein said at least a portion of said source/drain region comprises an extension implant region of said source/drain region.

11. The method of claim 7, wherein said at least a portion of said source/drain region comprises an extension implant region of said source/drain region.

12. A method, comprising:
- forming a doped region in a semiconductor substrate for an e-fuse device;
- forming a transistor structure in and above said substrate, said transistor comprising a doped source/drain region positioned in said substrate, said source/drain region including an extension implant region, wherein said doped region for said e-fuse device and said extension implant region are formed concurrently by performing a common implantation process;
- depositing a layer of transitional/refractory metal above at least a portion of said doped region of said e-fuse device and above said doped source/drain region of said transistor;
- performing at least one heat treatment process to cause portions of said layer of transitional/refractory metal to react with said substrate to form a first metal silicide region that is positioned on said doped region of said e-fuse device and a second metal silicide region that is positioned on said source/drain region of said transistor;
- after performing said at least one heat treatment process, removing unreacted portions of said layer of transitional/refractory metal; and
- performing at least one common process operation to form a first conductive contact that is positioned above and conductively coupled to said first metal silicide region and a second conductive contact that is positioned above and conductively coupled to said second metal silicide region, wherein said first and second conductive contacts are comprised of the same metal-containing material.

* * * * *